United States Patent
Thor et al.

(10) Patent No.: US 8,841,600 B2
(45) Date of Patent: Sep. 23, 2014

(54) HYSTERESIS-COMPENSATING INTERPOLATION CIRCUITS IN OPTICAL ENCODERS

(75) Inventors: Chung Min Thor, Ipoh (MY); Gim Eng Chew, Bayan Lepas (MY); Weng Chong Sam, Simpang Ampat (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 889 days.

(21) Appl. No.: 12/916,579

(22) Filed: Oct. 31, 2010

(65) Prior Publication Data

US 2012/0104236 A1    May 3, 2012

(51) Int. Cl.
G01D 5/34    (2006.01)
H01J 40/14    (2006.01)

(52) U.S. Cl.
USPC .................................. 250/231.16; 250/214 R

(58) Field of Classification Search
USPC ................ 250/231.13–231.18, 214 R, 214.1, 250/214 A, 221, 214 DC; 356/138, 139, 356/139.03–139.09, 614–617, 620, 622; 359/436–442; 341/13, 14; 33/1 R, 1 N, 33/1 M, 1 L, 1 SP, 1 PT
See application file for complete search history.

(56) References Cited

U.S. PATENT DOCUMENTS

| | | | |
|---|---|---|---|
| 4,342,910 A * | 8/1982 | Pfeifer et al. | ............ 250/237 G |
| 5,068,529 A * | 11/1991 | Ohno et al. | ............ 250/231.18 |
| 5,999,113 A | 12/1999 | Kiriyama et al. | |
| 6,297,811 B1 | 10/2001 | Kent et al. | |
| 6,355,927 B1 | 3/2002 | Snyder | |
| 7,071,669 B2 | 7/2006 | Morita | |
| 7,176,897 B2 | 2/2007 | Roberts | |
| 7,329,858 B2 | 2/2008 | Okada | |
| 7,394,061 B2 | 7/2008 | Saidan et al. | |
| 2003/0067451 A1 | 4/2003 | Tagg et al. | |
| 2006/0097991 A1 | 5/2006 | Hotelling et al. | |
| 2007/0074913 A1 | 4/2007 | Geaghan et al. | |

* cited by examiner

Primary Examiner — Pascal M Bui Pho

(57) ABSTRACT

Disclosed are various embodiments of circuitry and methods to compensate for variations in hysteresis associated with the comparators of an interpolation circuit in a single track optical encoder. Such variations in hysteresis may be minimized or eliminated by providing appropriately configured resistor ladder circuits to condition the inputs to the comparators, or by programming or trimming resistors in positive feedback loops of the comparators. The single track optical encoder configurations disclosed herein permit very high resolution reflective optical encoders in small packages to be provided. Methods of making and using such optical encoders are also disclosed.

19 Claims, 16 Drawing Sheets

HYSTERESIS-COMPENSATING INTERPOLATION CIRCUITS IN OPTICAL ENCODERS

FIELD OF THE INVENTION

Various embodiments of the inventions described herein relate to the field of optical encoders, and components, devices, systems and methods associated therewith.

BACKGROUND

Optical encoders are typically employed as motion detectors in applications such as closed-loop feedback control in motor control systems. By way of example, many optical encoders are configured to translate rotary motion or linear motion into a two-channel digital output for position encoding.

Many optical encoders employ an LED as a light source. In transmissive encoders, the light is collimated into a parallel beam by means of a lens located over the LED. Opposite the emitter is a light detector that typically consists of photodiode arrays and a signal processor. When a code scale such as a code wheel or code strip moves between the light emitter and light detector, the light beam is interrupted by a pattern of bars and spaces disposed on the code scale. Similarly, in reflective or imaging encoders, the lens over an LED focuses light onto the code scale. Light is either reflected or not reflected back to the lens disposed over the photo-detector. As the code scale moves, an alternating pattern of light and dark patterns corresponding to the bars and spaces falls upon the photodiodes. The photodiodes detect these patterns and corresponding outputs are processed by the signal processor to produce digital waveforms. Such encoder outputs are used to provide information about position, velocity and acceleration of a motor, by way of example.

A typical reflective optical encoder comprises a light detector, a light emitter and a code wheel or code scale. The detector generates an output by processing photocurrents provided by photodiode arrays included in the light detector. In general, reflective optical encoders include four photodiode channels, namely A, A/, B and B/, which are arranged along a single track in a 2-channel optical encoder. The photodiodes are arranged so that gaps separating adjacent photodiodes are sufficiently large to prevent or inhibit crosstalk from being generated between such adjoining photodiodes. In the prior art, as the resolution of an optical encoder increased, the spacing between adjoining photodiodes decreased, which in turn led to increased crosstalk between channels.

Interpolation circuitry is commonly employed in incremental and absolute digital motion encoding systems, where the interpolation circuitry is configured to generate digital pulses having higher frequencies than base sinusoidal analog signals input to the circuitry. As the interpolation factor of the circuitry increases, the accuracy of the interpolation circuitry becomes ever more critical since the output provided by such circuitry ultimately determines the accuracy of the encoding system. Unfortunately, due to the architecture of most interpolation circuitry—which typically relies on a large number of comparators—the outputs provided by interpolation circuitry tend to be noisy and contain undesired noise spikes arising from excessive switching in the comparators. As a result, the comparators employed in interpolation circuitry for motion encoders are typically characterized by a significant amount of hysteresis, which can provide some immunity from noise spikes. The hysteresis itself can become a source of inaccuracy for the interpolation circuitry, however, especially at high interpolation factors.

Referring to FIG. 1, there is shown an optical encoder system 10 of the prior art comprising light emitter 20 (typically an LED), code wheel or code strip 30 having apertures 31a-31f disposed therein, and light detector 40 comprising photodiodes 41a (A) and 41b (A\). In optical encoder 10, collimated light beam 22 emitted by light emitter 20 projects light onto code wheel 30. Collimated light beam 22 is interrupted by masked or optically opaque sections disposed between apertures 31a-31f as code wheel or code strip 30 rotates in first direction 111 or in second direction 112. (Note that code wheel or code strip 30 rotates substantially in a plane defined approximately by collimated light beam 22 as it is projected from light emitter 20 towards light detector 40.) Portions 50a and 50b of collimated light beam 22 project through apertures 31c and 31d and sweep across light detector 40 and photodiodes 41b (A\) and 41a (A) as code wheel or code strip 30 rotates in direction 111 or 112 in the plane. As code wheel 30 moves in direction 111 or 112, the light patterns projected onto first vertical portion 70 of light detector 40 by beam portions 50a and 50b change, and the output signals provided by photodiodes 41a and 41b change correspondingly. These output signals are generally employed to generate a pair of quasi-triangular signals (as shown, for example, in FIG. 2), which are then used to determine any one or more of the position, speed and direction of code disk 30.

Referring now to FIG. 2, there are shown "triangular" signals A and A\, which are compared to one another and employed to generate pulse 109 using circuitry and methods well known to those skilled in the art of optical encoders. Typically, another set of photodetectors B and B\ is also provided, where photodetectors B and B\ are positioned 90 degrees out of phase with respect to photodetectors A and A\, and which are employed to generate another pulse (not shown in FIG. 2). Pulses for photodetectors A and A\, and B and B\, are generated which are 90 degrees out of phase with respect to one another. As shown in FIG. 2, pseudo-triangular signals A and A\, which for purposes of subsequent interpolation processing would optimally be linear or straight between maximum and minimum portions thereof, exhibit curved portions near the tops and bottoms thereof. These curved portions are due to undesirable capacitance effects, and complicate considerably any subsequent attempts at interpolation.

In an encoder of the type shown in FIG. 1, the spatial resolution of device 10 is generally determined and set according to the specific requirements of the end user. More particularly, the distances or spacing between adjoining photodetectors A and A\ (41a and 41b, respectively), are typically determined according to the particular requirements of a given customer or end user. Time and effort are required to implement such requirements, especially in respect of wafer fabrication when an unusual or new spatial resolution for device 10 is required.

One technique employed in the prior art to change or adjust the spatial resolution provided by device 10 is to employ one or more reticles disposed between light emitter 20 and light detector 40. FIG. 3 shows one such arrangement, where reticle strip 60 has reticles 61 and 62 disposed therein. Reticles 61 and 62 are configured to interfere with the light beams impinging thereon, and to modify them so that the pattern of light projected on light detectors 40 is changed. Reticles 61 and 62 are specifically configured to provide the degree, amount and type of spatial resolution desired of encoder 10.

FIG. 4 shows a conventional prior art single track optical encoder 10 with photodiode array 20 comprising detectors A, A\, B and B\ in a two-channel encoder with associated code strip 30. Signals generated by detectors A and A\ (channel A) and B and B\ (channel B) are also shown in FIG. 4, where the Channel B output signal lags the Channel A output signal by 90 degrees. (The relatively simple circuitry employed to generate output signals for channels A and B is not shown in FIG. 4, but is well known to those skilled in the art and therefore need not be discussed further herein.) The separation between adjoining photodiodes in array 20 and the width of each photodiode is selected according to the resolution that is required of the optical encoder. When the resolution of optical encoder 10 is increased, either the spacing w between adjoining photodiodes is reduced, or the width of each photodiode along common axis 15 is reduced, or both, resulting in photodiode spacing z being decreased, where z is the spacing between the leading or trailing edges of adjoining photodiodes.

Note that in optical encoder 10 illustrated in FIG. 4, the spacing z between the leading or trailing edges of adjoining photodiodes corresponds to one-quarter the combined width of a single pair of adjoining light and dark strips on code scale 30. As a result, two photodiodes are contained within a distance defining the length of each such strip along common axis 15. Note further that in optical encoder 10 illustrated in FIG. 4, all photodiodes disposed along single track or common axis 15 are arranged in the order or sequence A, B, A\, and B\.

Two issued patents which discuss interpolation circuits are U.S. Pat. No. 6,355,927 entitled "Interpolation Methods and Circuits for Increasing the Resolution of Optical Encoders" to Snyder and U.S. Pat. No. 6,816,091 entitled "Interpolator" to Chee, the respective entireties of which are hereby incorporated by reference herein.

A block diagram of a prior art interpolation circuit 120 is shown in FIG. 5. The A, A\, B and B\ ramp signals are input to a signal generating circuit 140. The signal generating circuit 140 provides A, A\, A√3, B, B\, and B√3 ramp signals to a comparator circuit 142. Comparator circuit 142 compares selected pairs of the A, A\, A√3, B, B\, and B√3 ramp signals and generates a set of eight intermediate signals on lines 144. The intermediate signals are supplied to a logic circuit 150, which combines the intermediate signals and generates channel A and channel B output signals as described below.

FIG. 6 shows a schematic block diagram of prior art signal generating, comparator and logic circuitry configured to receive input signals A, A\, B and B\ and to provide channel A and channel B outputs therefrom. Signal generating circuit 140 includes attenuating amplifiers 220 and 222, each having a gain of one third. Amplifier 220 generates the fractional A√3 ramp signal, and amplifier 222 generates the fractional B√3 ramp signal. The A, A\, B and B\ input ramp signals may be scaled if desired. The A\ and B\ ramp signals may be generated by inverting the A and B ramp signals if desired. However, the A, A\, B, B\, fractional A√3 and fractional B√3 ramp signals supplied to comparator circuit 142 have the amplitude and phase relationships shown in FIG. 7 and described below.

Comparator 142 includes comparators 240, 242, 244, 246, 248, 250, 252 and 254. Each of the comparators compares a selected pair of ramp signals and outputs an intermediate signal. In particular, comparator 240 compares the B and B\ ramp signals and generates a B-B\ intermediate signal. Similarly, comparator 242 outputs an A\-B\ intermediate signal; comparator 244 outputs an A\-A intermediate signal; comparator 246 outputs a B\-A intermediate signal; comparator 248 outputs an A√3-B\ intermediate signal; comparator 250 outputs an A\-B√3 intermediate signal; comparator 252 outputs a B√3-A intermediate signal; and comparator 254 outputs an A√3-B intermediate signals. As described below, the intermediate signals are uniformly distributed in phase for ideal input signals.

Logic circuit 150 includes exclusive OR gates 270, 272, 274 and 276, and OR gates 280 and 282. Exclusive OR gate 270 receives the B-B\ and A\-B\ intermediate signals and supplies an output to OR gate 280. Exclusive OR gate 272 receives the A\-A and the B\-A intermediate signals and provides an output to OR gate 280. The output of OR gate 280 is the channel B output signal. Exclusive OR gate 274 receives the A√3-B\ and A\-B√3 intermediate signals and provides an output to OR gate 282. Exclusive OR gate 276 receives the B√3-A and A√3-B intermediate signals and provides an output to OR gate 282. The output of OR gate 282 is the channel A output signal.

In the circuitry shown in FIG. 6, voltage amplifiers are employed to generate fractional signals. One of the disadvantages by using voltage amplifiers in signal generating circuit 140 is that the range of fractional signals generated is to the voltage output swings of the various voltage amplifiers that are employed. The output of each voltage amplifier is limited by its particular circuit topology and architecture, the process technology that has been employed, and the power supply that is provided thereto during operation. The greater the number of interpolation factors required for a given application, the greater the number of fractional signals that need to be generated using additional voltage amplifiers. When interpolation encoders are used in for high frequency applications, speed becomes a major concern for voltage amplifiers.

In addition, many motion control encoders feature designs that have reached their limits with respect to frequency, performance, and accuracy due to process and delay variations caused by the varying hystereses associated with different comparators. For higher-frequency interpolated outputs provided by an optical encoder, and without appropriate signal calibration, the performance of the encoder may depend heavily on the quality of the incoming signal, as well as on part-to-part variations between comparators in the interpolator block. Moreover, the hysteresis of the comparators may vary in accordance with changes in the frequency of the incoming signals, or because of process mismatches. Without expensive signal conditioning circuitry, distorted incoming signals can cause errors, inaccuracies and distortions in the output signals provided by the comparators.

What is needed is an interpolation encoder that can overcome at least some of the foregoing problems.

SUMMARY

In some embodiments, there is provided a high resolution, high speed, single track optical encoder, comprising a light emitter configured to emit light therefrom, a plurality of photodetectors or photodiodes having leading and trailing edges arranged along a single track and a common axis to form a single track light detector, the single track light detector having disposed along the common axis pairs of A and A\ data channel light detectors and B and B\ data channel light detectors, the A and B light detectors, and the A\ and B\ light detectors, respectively, being arranged to generate output signals that are 90 degrees out of phase with respect to one another, the A, A\, B and B\ light detectors generating respective first, second, third and fourth output ramp signals, signal generation circuitry comprising at least first, second, third and fourth amplifiers configured to receive as inputs thereto, respectively, the first, second, third and fourth output ramp signals corresponding to the A, A\, B and B\ light detectors, the first amplifier being configured to provide full A and fractional A output ramp signals, the second amplifier being configured to provide full A\ and fractional A\ output ramp signals, the third amplifier being configured to provide full B and fractional B output ramp signals, the fourth amplifier being configured to provide full B\ and fractional B\ output ramp signals, a first set of first, second, third and fourth resistor ladders configured to receive the full A and fractional A output ramp signals, full A\ and fractional A\ output ramp signals, the B and fractional B output ramp signals, and the full B\ and fractional B\ output ramp signals, respectively, as input signals thereto, respectively, each of the first, second, third and fourth resistor ladders having resistor values associated therewith such that intermediate output signals provided by each of the resistor ladders all have substantially the same slope or complementary slope at any given time, a first comparator configured to receive the A and fractional A intermediate output signals, a second comparator configured to receive the A\ and fractional A\ intermediate output signals, a third comparator configured to receive the B and fractional B intermediate output signals, and a fourth comparator configured to receive the B\ and fractional B\ intermediate output signals as inputs thereto, the first, second, third and fourth comparators providing intermediate first, second, third and fourth output signals therefrom, respectively, and logic circuitry configured to receive the resistor ladder output signals and generate channel A and channel B output square wave or pulse signals on the basis of the resistor ladder output signals, wherein the first set of first, second, third and fourth resistor ladders have resistor values associated therewith such that the intermediate output signals provided by each of the resistor ladders all have substantially the same slope or complementary slope at any given time and thereby eliminate differences in hysteresis between the first, second, third and fourth comparators.

The foregoing high resolution, high speed, single track optical encoder may further comprise a second set of first, second, third and fourth tunable resistor ladders configured to receive the intermediate first, second, third and fourth output signals as input signals thereto, respectively, each of the first, second, third and fourth resistor ladders of the second set of resistor ladders having tunable resistances associated therewith that may be selected by first, second, third and fourth control signals delivered thereto, respectively, such that output signals provided by each of the resistor ladders all have substantially the same slope or complementary slope at any given time, or alternatively may further comprise a second set of first, second, third and fourth tunable resistor ladders configured to receive the intermediate first, second, third and fourth output signals as input signals thereto, respectively, each of the first, second, third and fourth resistor ladders of the second set of resistor ladders having trimmable resistances associated therewith that may be selected, respectively, such that output signals provided by each of the resistor ladders all have substantially the same slope or complementary slope at any given time.

In other embodiments, there is provided a high resolution, high speed, single track optical encoder, comprising a light emitter configured to emit light therefrom, a plurality of photodetectors or photodiodes having leading and trailing edges arranged along a single track and a common axis to form a single track light detector, the single track light detector having disposed along the common axis pairs of A and A\ data channel light detectors and B and B\ data channel light detectors, the A and B light detectors, and the A\ and B\ light detectors, respectively, being arranged to generate output signals that are 90 degrees out of phase with respect to one another, the A, A\, B and B\ light detectors generating respective first, second, third and fourth output ramp signals, signal generation circuitry comprising at least first, second, third and fourth amplifiers configured to receive as inputs thereto, respectively, the first, second, third and fourth output ramp signals corresponding to the A, A\, B and B\ light detectors, the first amplifier being configured to provide full A and fractional A output ramp signals, the second amplifier being configured to provide full A\ and fractional A\ output ramp signals, the third amplifier being configured to provide full B and fractional B output ramp signals, the fourth amplifier being configured to provide full B\ and fractional B\ output ramp signals, a first comparator configured to receive the A and fractional A output ramp signals, a second comparator configured to receive the A\ and fractional A\ output ramp signals, a third comparator configured to receive the B and fractional B output ramp signals, and a fourth comparator configured to receive the B\ and fractional B\ output ramp signals as inputs thereto, the first, second, third and fourth comparators providing intermediate first, second, third and fourth output signals therefrom, respectively, first, second, third and fourth tunable resistor ladders configured to receive the intermediate first, second, third and fourth output signals as input signals thereto, respectively, each of the first, second, third and fourth resistor ladders having tunable resistances associated therewith that may be selected by first, second, third and fourth control signals delivered thereto, respectively, such that output signals provided by each of the resistor ladders all have substantially the same slope or complementary slope at any given time, and logic circuitry configured to receive the resistor ladder output signals and generate channel A and channel B output square wave or pulse signals on the basis of the resistor ladder output signals.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings, unless otherwise noted.

DETAILED DESCRIPTIONS OF SOME EMBODIMENTS

In various embodiments of the invention, single track reflective optical encoder systems, devices and methods, are provided.

As employed herein, the term "single track encoder" means an optical encoder having a single code scale having data or code patterns or bars formed or presented thereon or therein, as well as index patterns or bars formed or presented thereon or therein, where the data and index patterns travel together along a common single axis in a single track disposed over a corresponding single track comprising data channel and index channel light detectors.

Figure 1:
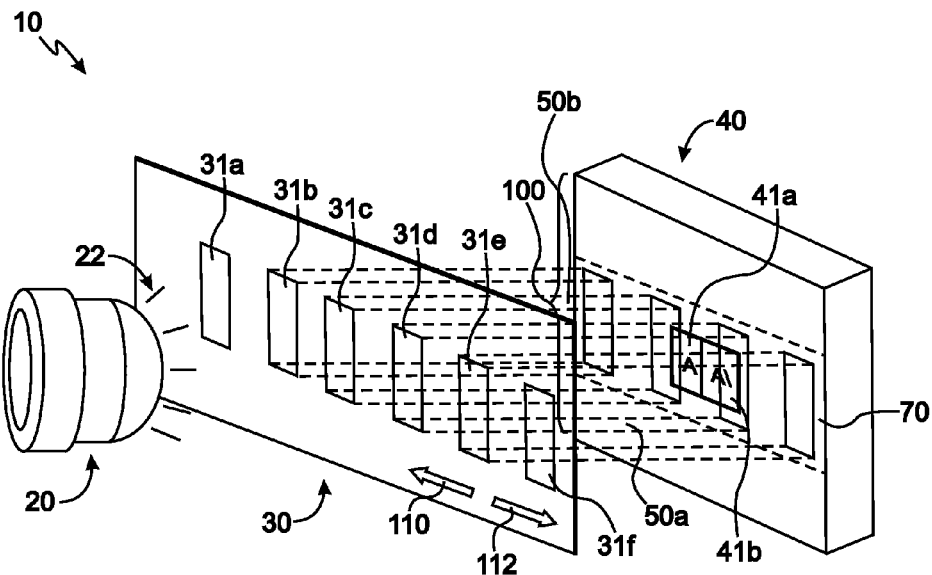
FIG. 1 shows a prior art optical encoder system 10.
Figure 2:
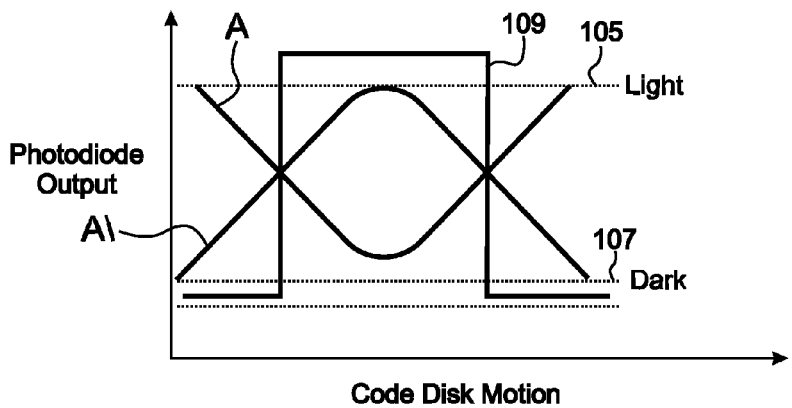
FIG. 2 shows "triangular" signals A and A\.
Figure 3:
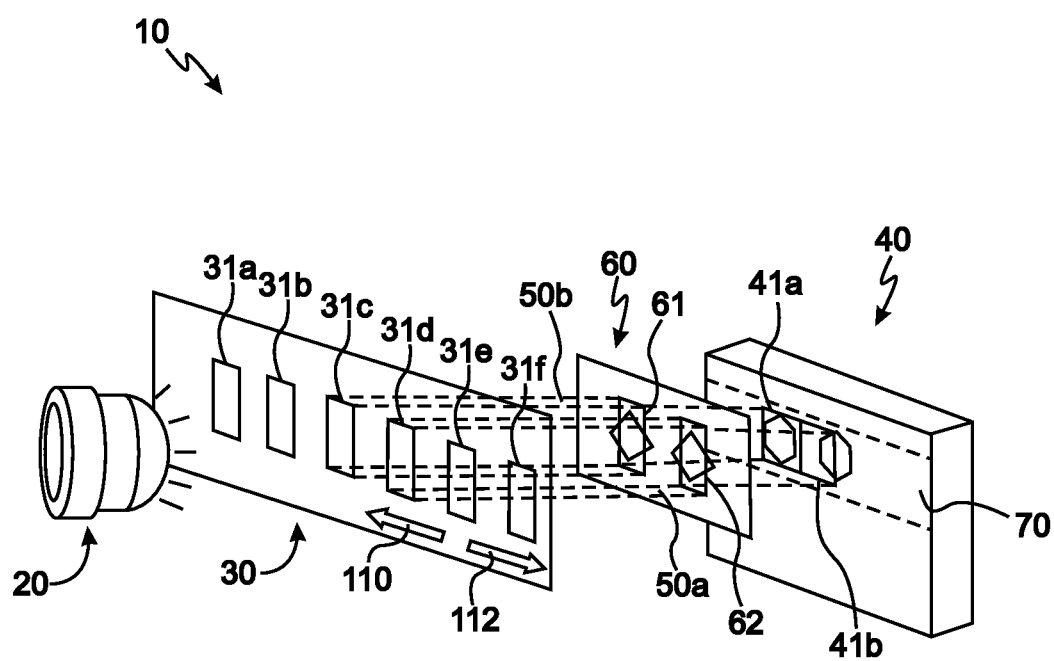
FIG. 3 shows a prior art optical encoder 10 having a reticle 30 disposed between light emitter 20 and light detector 40.
Figure 4:
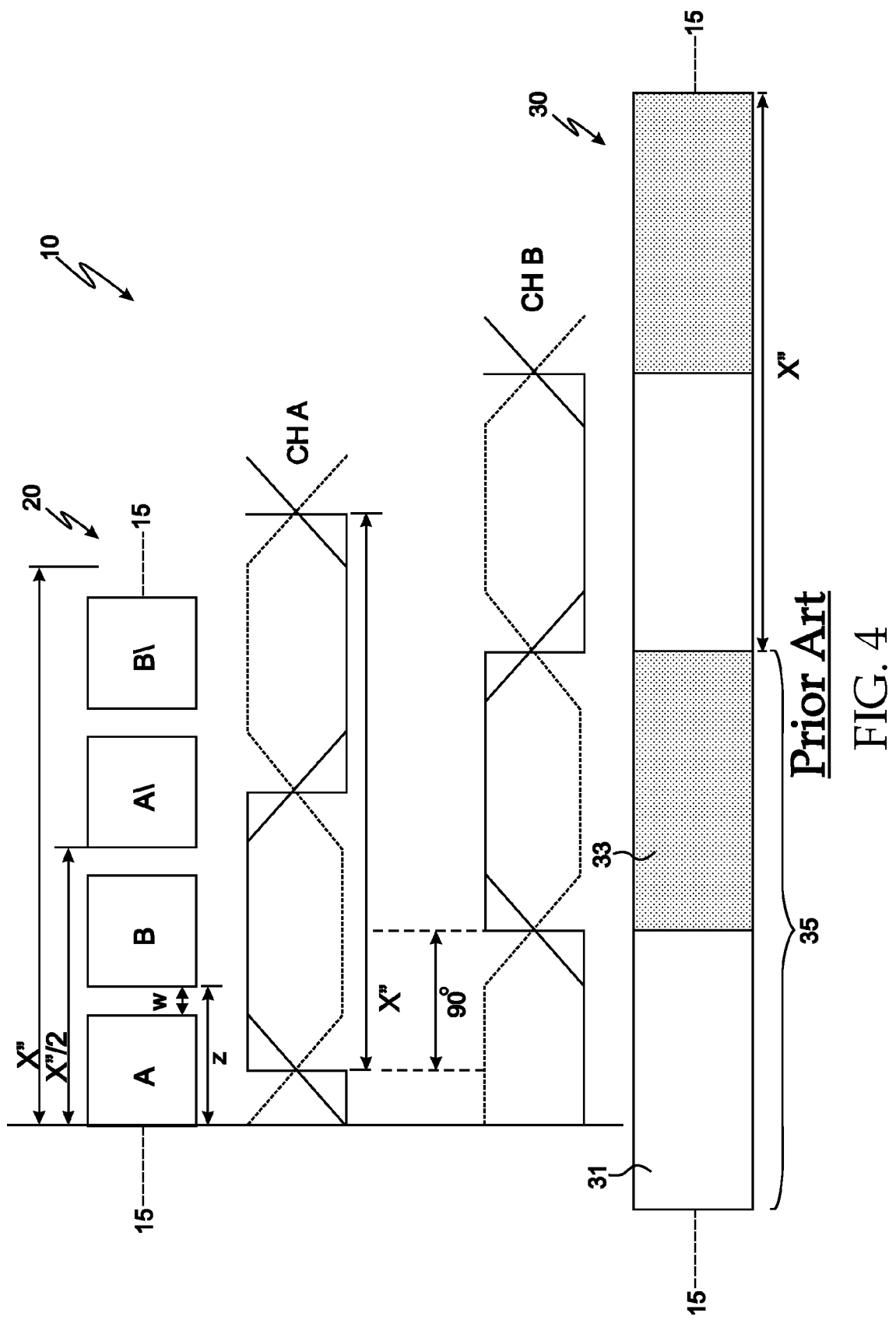
FIG. 4 shows one embodiment of a prior art optical encoder 10 having spatial resolution X"/4.
Figure 5:
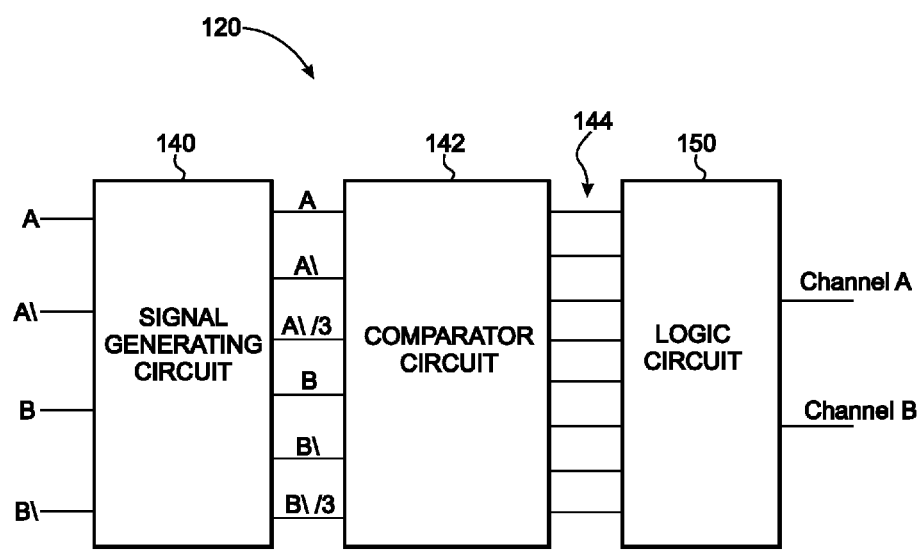
FIG. 5 shows a prior art signal generating, comparator and logic circuit 120.
Figure 6:
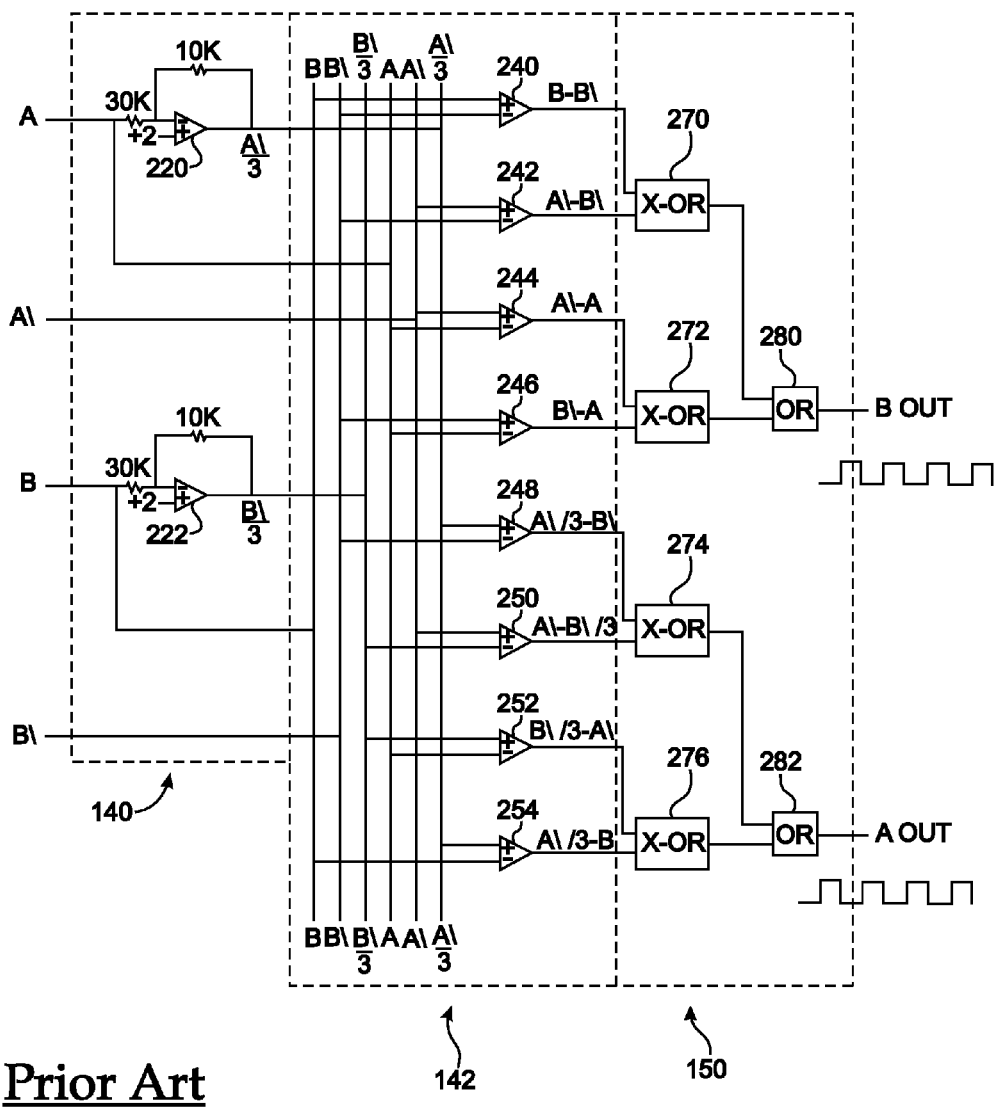
FIG. 6 shows another prior art signal generating, comparator and logic circuit 120.
Figure 7:
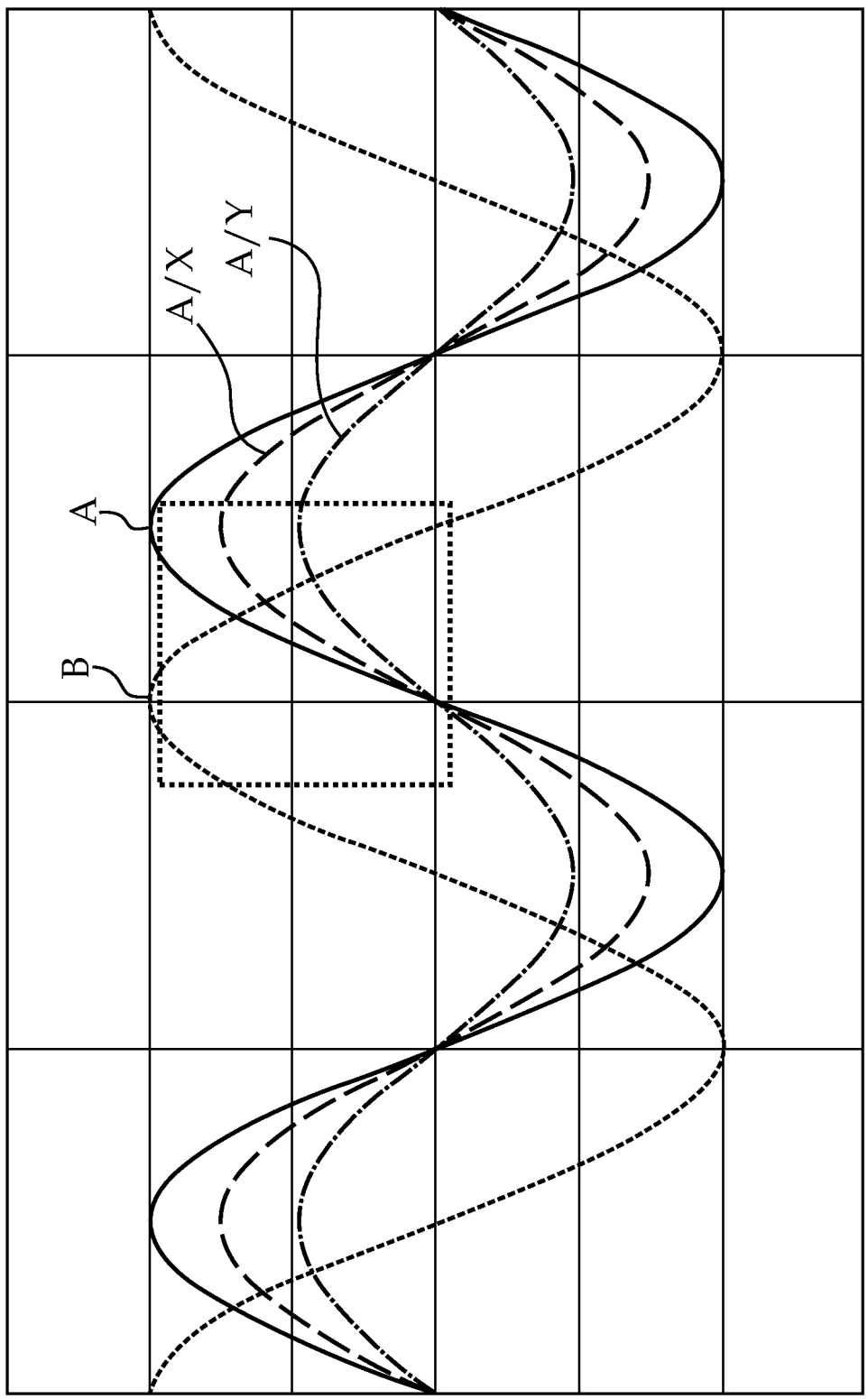
FIG. 7 shows output signals generated by circuit 140 of FIG. 6.

Referring now to FIG. 7, there are shown output signals generated by circuits 140 and 142 of FIG. 6. The various inputs to signal generating circuit 140 shown in FIG. 5 comprise different sinusoidal signals which cross one another at various cross points, on the basis of which interpolated pulse signal or square wave outputs are generated (as described above in connection with FIG. 2). When two sinusoidal signals cross one another, a comparator is used to generate a square wave or pulse signal output (see signals A, A\ and 109 in FIG. 2, for example). Comparators having specific respective hystereses associated therewith are required to accurately process these sinusoidal input signals at the cross points where pairs of such intersecting signals intersect so as to provide accurately interpolated output signals.

Figure 8:
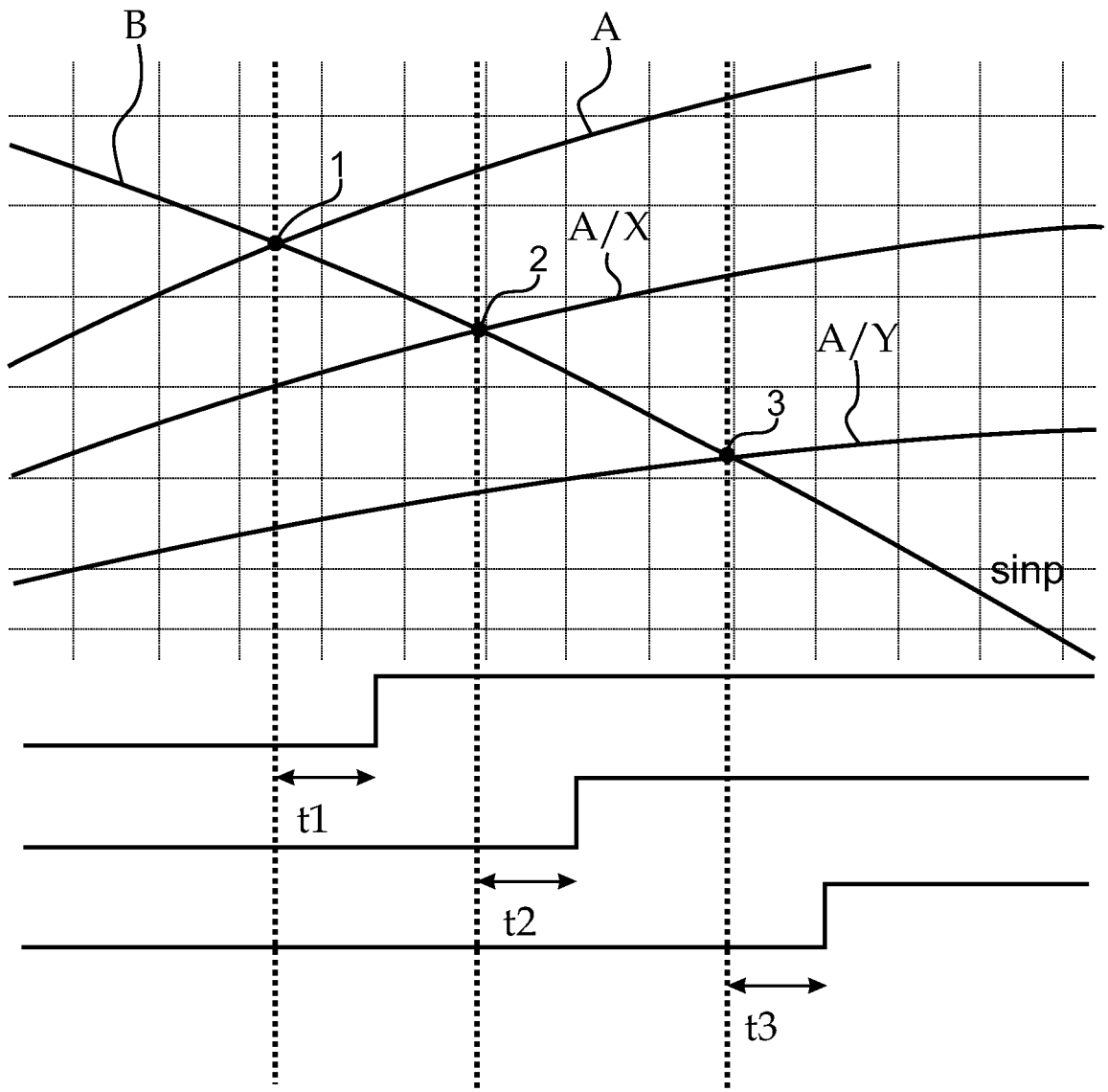
FIG. 8 shows a close-up portion of the signals shown in FIG. 7.

Continuing to refer to FIG. 7, there are shown input signals B, A, A/X and A/Y. Input signals B and A are ninety degrees out of phase with respect to one another. Signals A/X and A/Y are attenuated versions of signal A, but have the same phase. FIG. 8 shows an enlarged view of the portion of FIG. 7 delineated by a dotted box. As shown in FIG. 8, signal B intersects signals A, A/X and A/Y at cross points 1, 2 and 3. Variable and non-uniform hysteresis delays, represented by time delays t1, t2 and t3 in FIG. 8, are associated with generating square wave output signals using comparators receiving signals B, A, A/X and A/Y as inputs thereto. Variable and non-uniform hysteresis delays represented by time delays t1, t2 and t3 in FIG. 8 are caused by signals A, A/X and A/Y having differing respective slopes or complementary slopes in the vicinities of respective cross points 1, 2 and 3. In the example of FIG. 8, time delay t1 must have a comparator hysteresis value of 40 mV associated therewith, time delay t2 must have a comparator hysteresis value of 30 mV associated therewith, and time delay t3 must have a hysteresis value of 20 mV associated therewith if the accuracy of the interpolated output signals is to be maintained by having t1, t2 and t3 all have the same switching delay. For good interpolation performance, t1 must be equal to t2 and to t3. In a traditional method, and as described above, comparators having differing values of hysteresis associated therewith are required to produce such a result.

Figure 9:
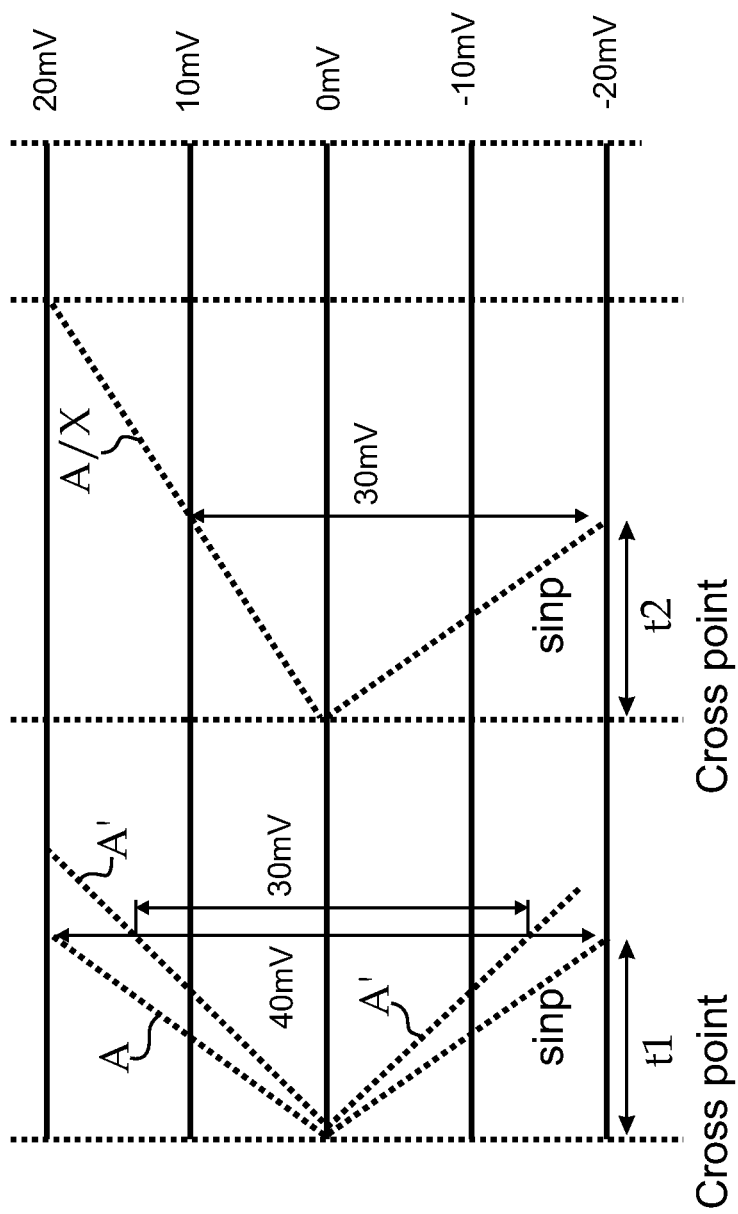
FIG. 9 illustrates one embodiment for adjusting and compensating different sinusoidal output signals to have the same hysteresis.
Figure 10:
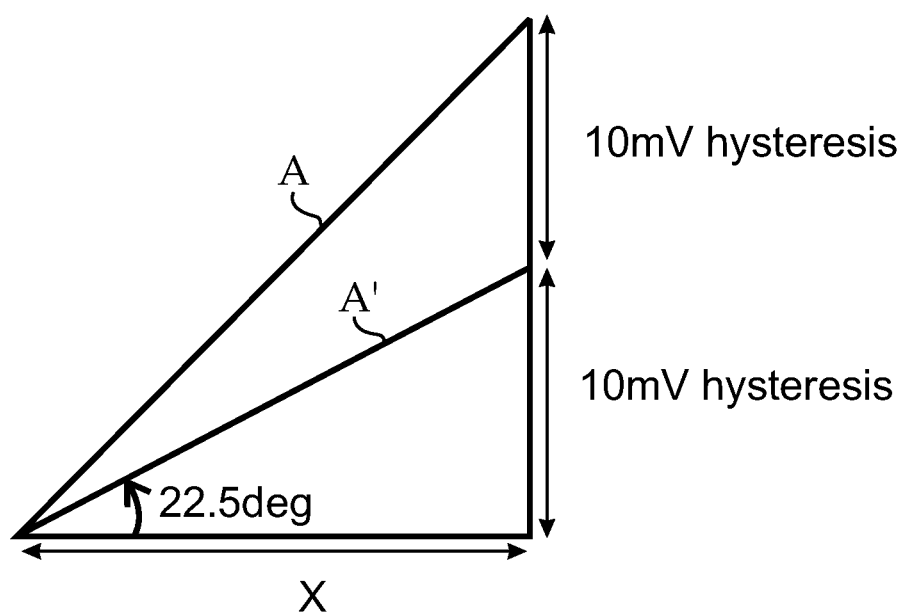
FIG. 10 shows another embodiment for adjusting and compensating different sinusoidal output signals to have the same hysteresis.

One solution to the problem of comparators having differing hysteresis values associated therewith is illustrated in FIGS. 9 and 10, where signal A is attenuated slightly to have the same slope as signal B (signal A'), with a resulting hysteresis value of 30 mV being associated with signals A' and A/X. Doing so does not affect interpolation performance because delay t2 equals delay t1.

Figure 11:
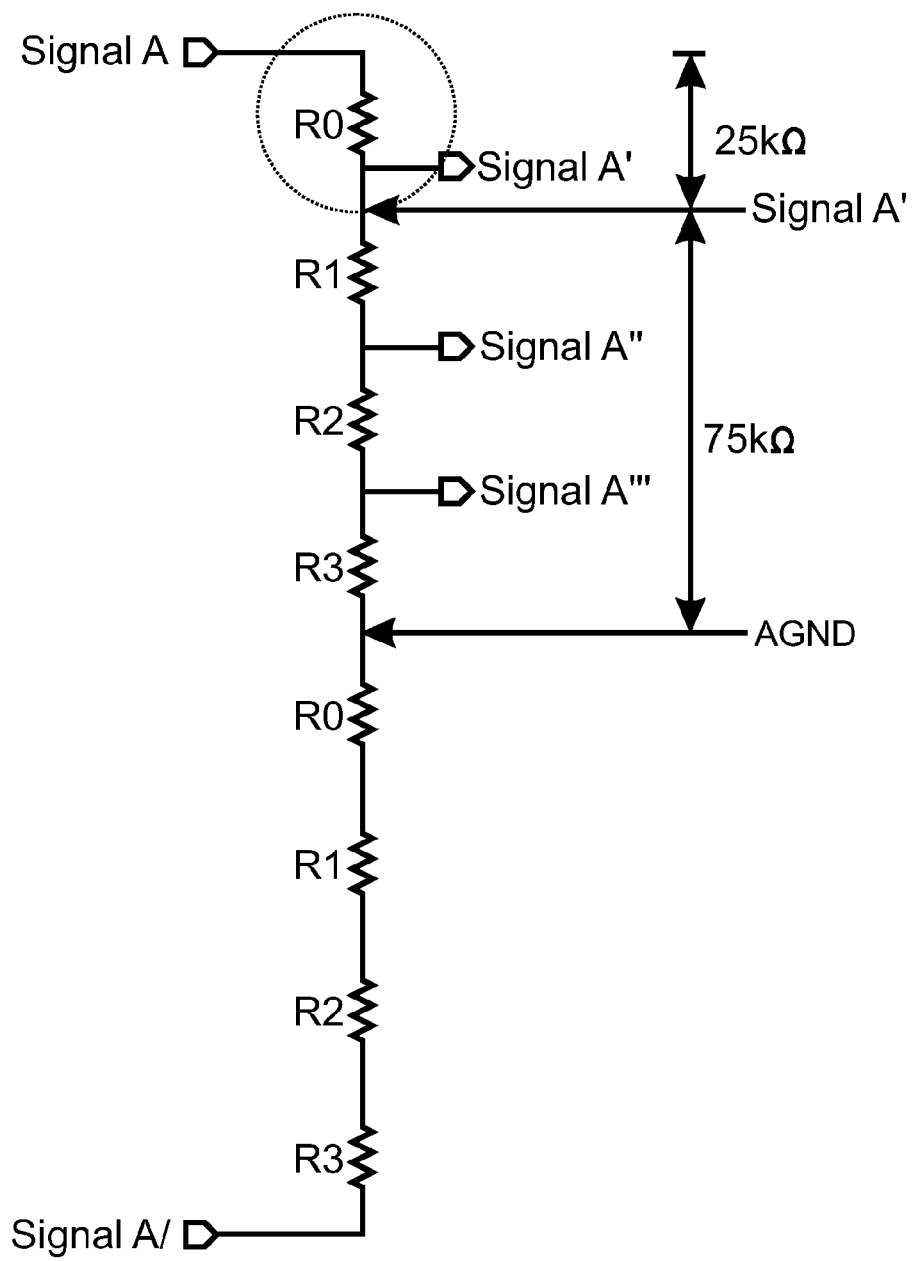
FIG. 11 shows one embodiment of a resistor ladder circuit for adjusting sinusoidal output signals to have the same hysteresis.

In one embodiment, and as illustrated in FIG. 11 by one of a first set of resistor ladders, the attenuation factor of signal A shown in FIGS. 7, 8 and 9 is calculated as (30 mV/40 mV), which is equal to a factor of 0.75. A simple attenuation circuit that accomplishes such a result using resistor ladder 312 is illustrated in FIG. 11. In one embodiment, a first set of first, second, third and fourth resistor ladders are provided for each of channels A, A\, B and B\ that have resistor values associated therewith configured to provide output signals therefrom that have substantially the same slope or complementary slope at any given time. This first set of resistor ladders eliminates the need to provide first, second, third and fourth comparators having differing hysteresis values associated therewith. Logic circuitry 150 of FIGS. 5 and 6 is then configured to receive the first set of resistor ladder output signals and generate channel A and channel B output square wave or pulse signals on the basis of the output signals provided by the first set of resistor ladders. Note that the illustrated techniques and circuitry are applicable to all ranges of interpolation factors such as 1X, 2X, 4X and greater, depending on interpolator block limitations.

Figure 12:
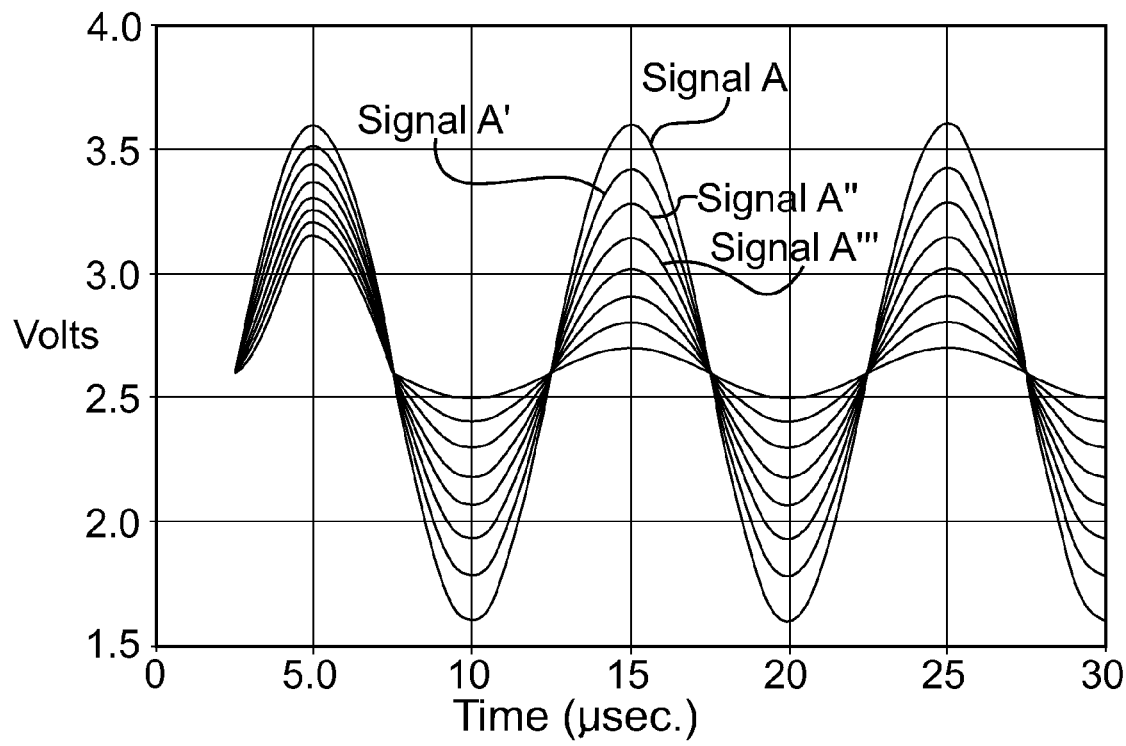
FIG. 12 shows one embodiment of a plurality of sinusoidal output signals having different attenuation factors applied thereto.
Figure 13:
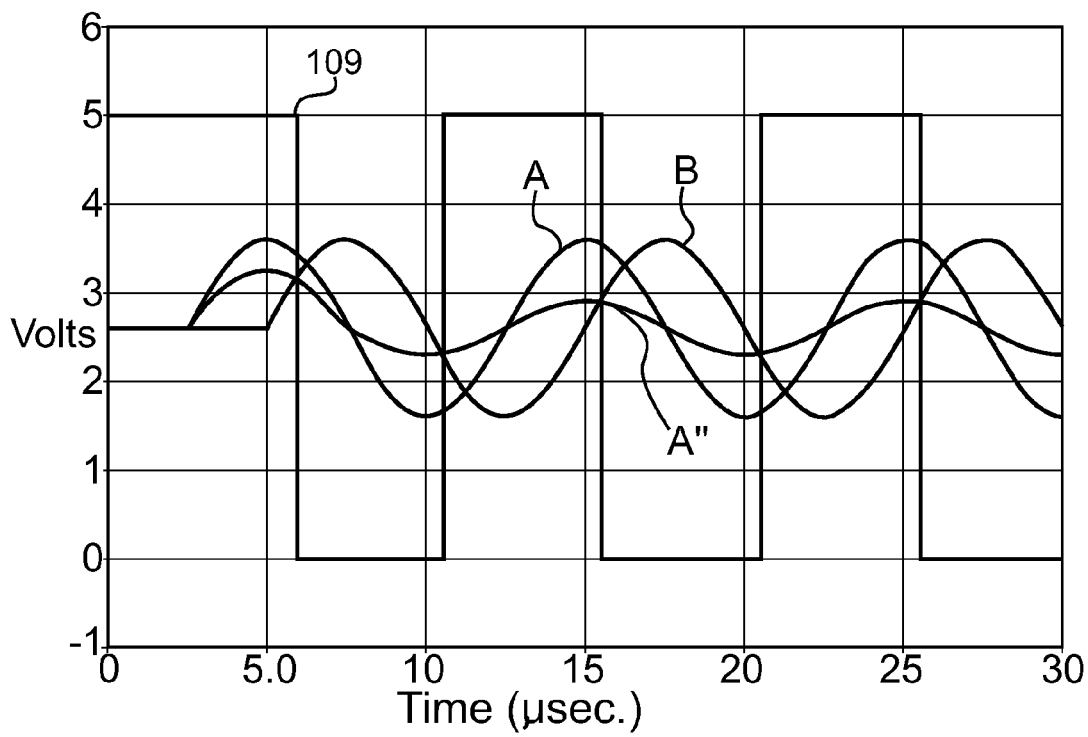
FIG. 13 shows one embodiment of sinusoidal output signals A, B and A" and corresponding pulse output signals generated in accordance therewith.
Figure 14:
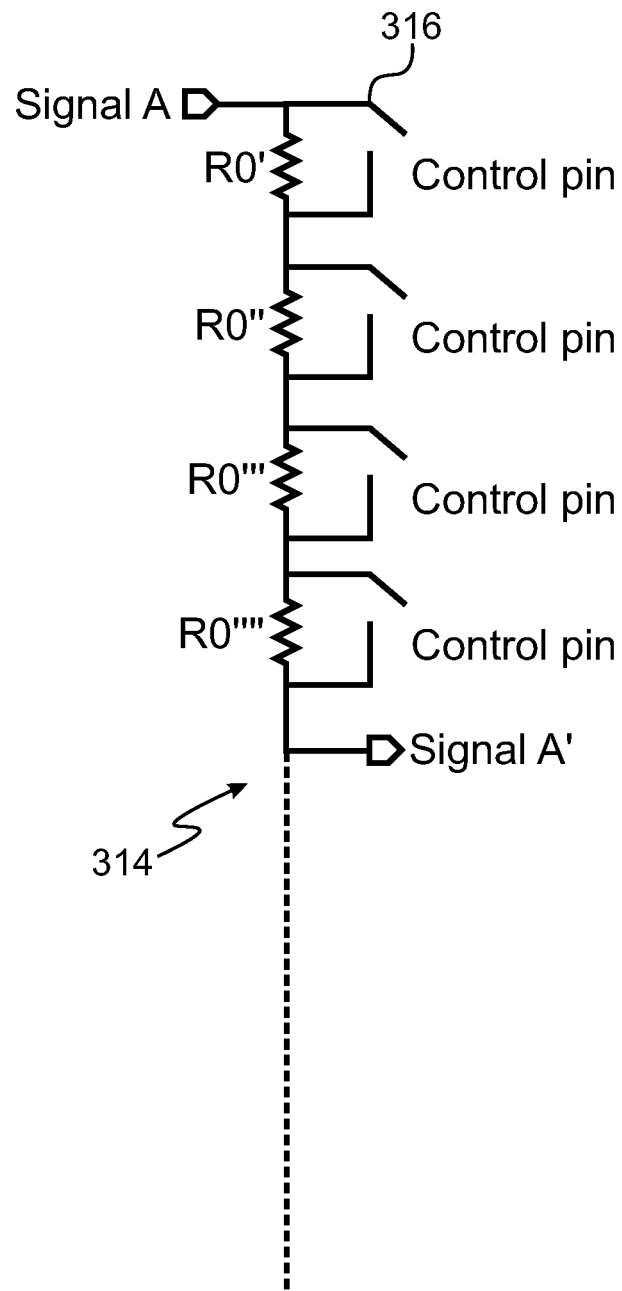
FIG. 14 shows a switchable and/or tunable resistor ladder circuit for fine-tuning the hysteresis of sinusoidal output signals.

Referring now to FIGS. 12 through 15, there is shown and illustrated another embodiment which employs a second set of resistor ladders (one of which—resistor ladder 314—is shown in FIG. 14), in addition to the first set of resistor ladders, to accomplish a result similar to but improved with respect to that described above in connection with the embodiment illustrated in FIGS. 7 through 11. Output signals A, A', A", and A''' output from resistor ladder 312 of FIG. 11 are shown in FIG. 12. FIG. 13 shows signals A, B and A", and square wave signals 109 generated by comparators on the basis thereof. Remaining slight mismatches between the crossings of signals A, B and A" of FIG. 13 are corrected using resistor ladder 314 of FIG. 14, which fine tunes signal A, for example, by trimmably or programmably controlling control pins 316 of FIG. 14 so as to provide optimal signal crossings. Similar fine-tuning resistor ladders 314 are provided for B and other signals.

Figure 15:
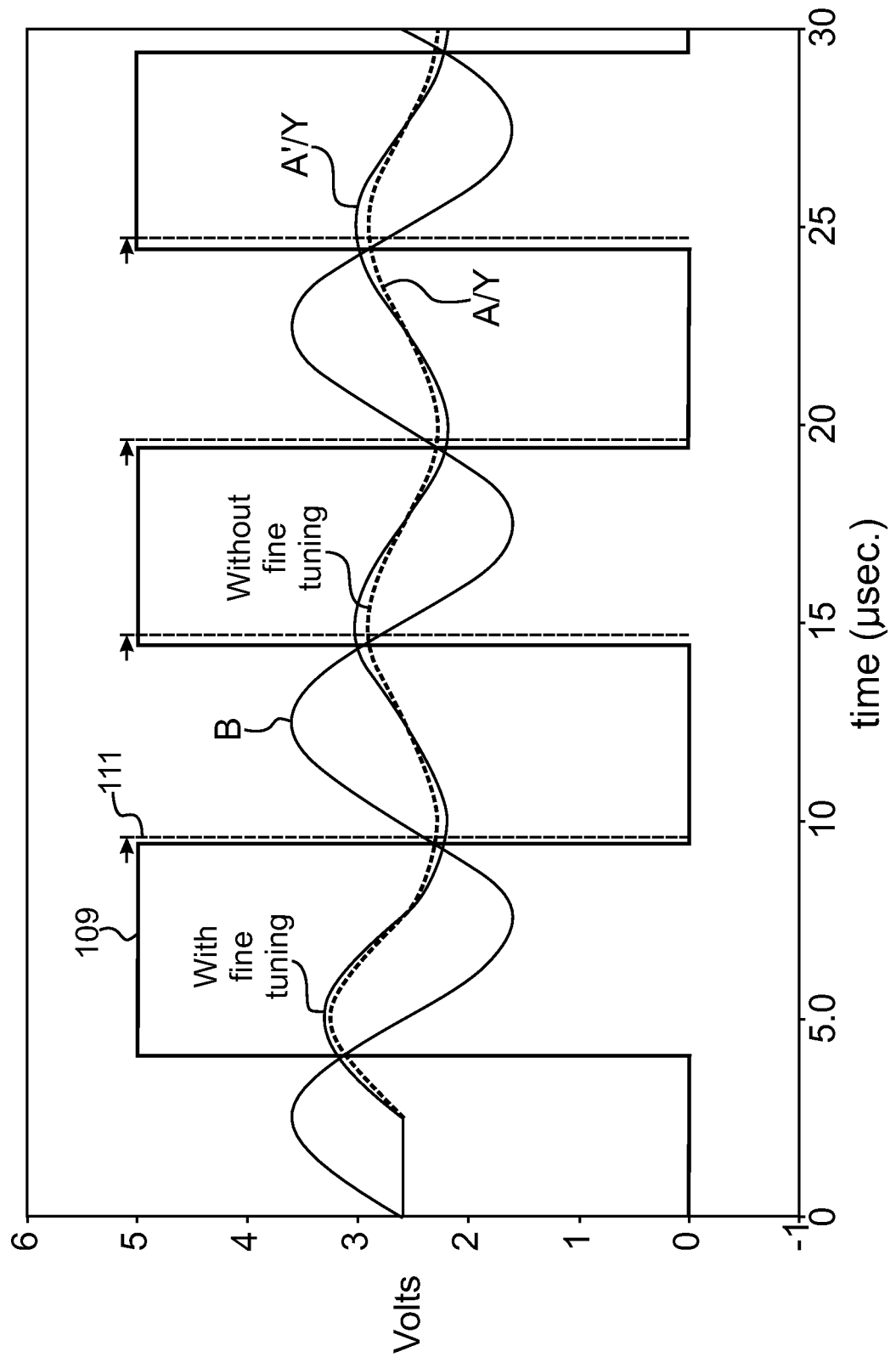
FIG. 15 shows one embodiment of sinusoidal output signals B, A/Y and A'/Y with corresponding pulse output signals generated in accordance therewith.

Signal A'/Y of FIG. 15 (dashed line), which has not been fine-tuned by resistor ladder 314 of FIG. 14, will be seen to be slightly offset with respect to time and the desired crossing with signal B. See the leading and trailing edges of square wave signal 111 in FIG. 15, which are offset from the desired leading and trailing edges of square wave signal 109. Fine-tuning resistor ladder 314 corrects the undesired offset of signal A'/Y by accurately aligning intermediate output signal A/Y.

Control pins 106 of FIG. 14 may be set during manufacturing by trimming, or may be programmably controlled using control signals delivered by a controller or processor having preprogrammed instructions loaded in a memory thereof.

It will now be seen that the various embodiments described above eliminate the variable hysteresis-induced delays and process variations caused by comparators having differing hysteresis values by employing comparators that all have the same comparator hysteresis in conjunction with easily-implemented resistor ladders. Interpolation accuracy and performance remain the same when operating over all ranges of frequency because at any given operating frequency all the resulting signal crossings have the same switching delays associated therewith. Thus, only a single type of hysteresis comparator need be employed. With only a single type of hysteresis comparator employed to detect all signal crossings, mismatches between crossings are minimized and performance is enhanced. Moreover, all attenuated intermediate output signals may be generated by a simple resistor ladders, which helps eliminate or minimize errors between attenuated intermediate output signals arising, for example, from part-to-part or component-to-component variations. In addition, the embodiments described above are simple and easy to implement, and provide optical encoders having improved high-frequency performance in comparison to conventional optical encoders.

Figure 16:
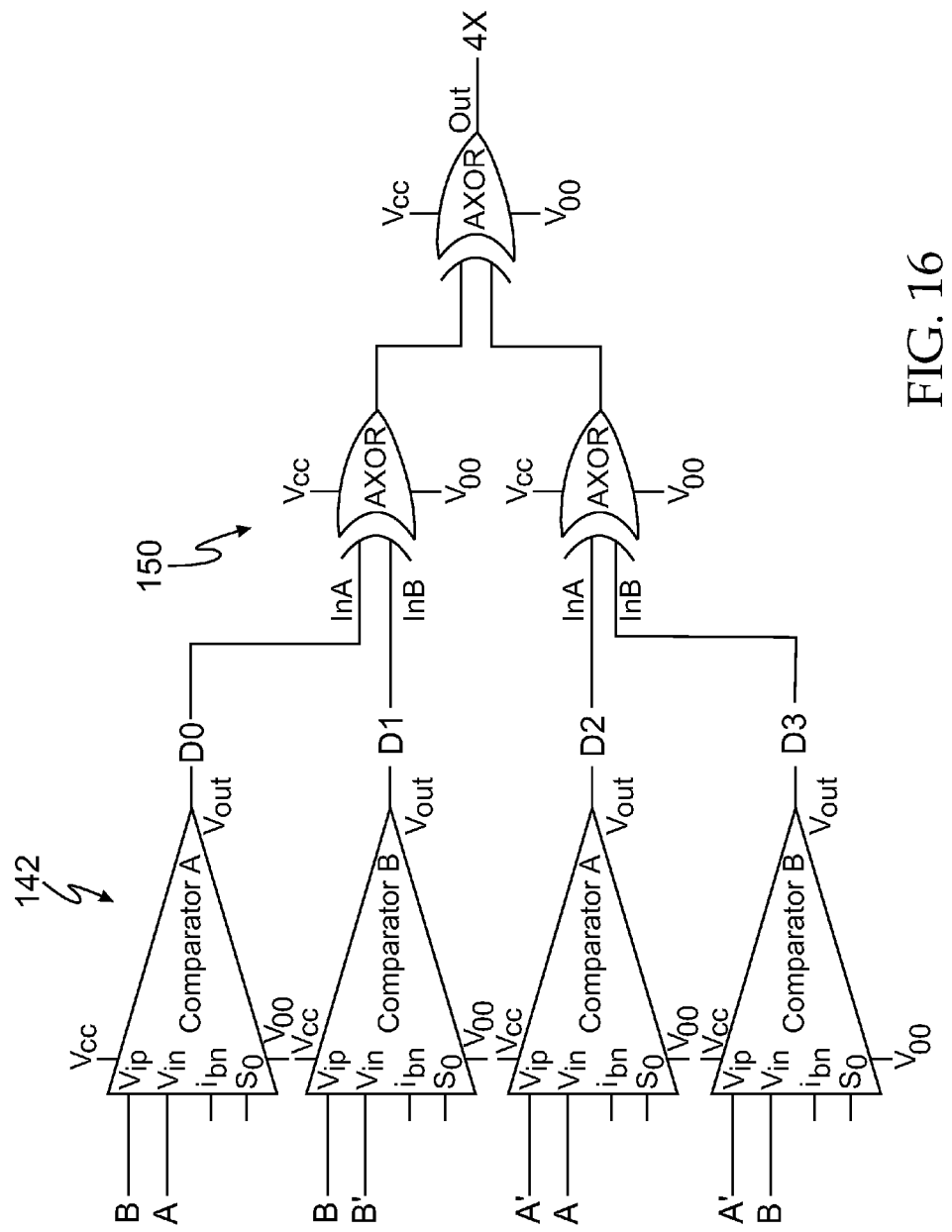
FIG. 16 shows one embodiment of a comparator circuit 142 and corresponding logic circuit 150 for generating a 4x pulsed output signal.
Figure 17:
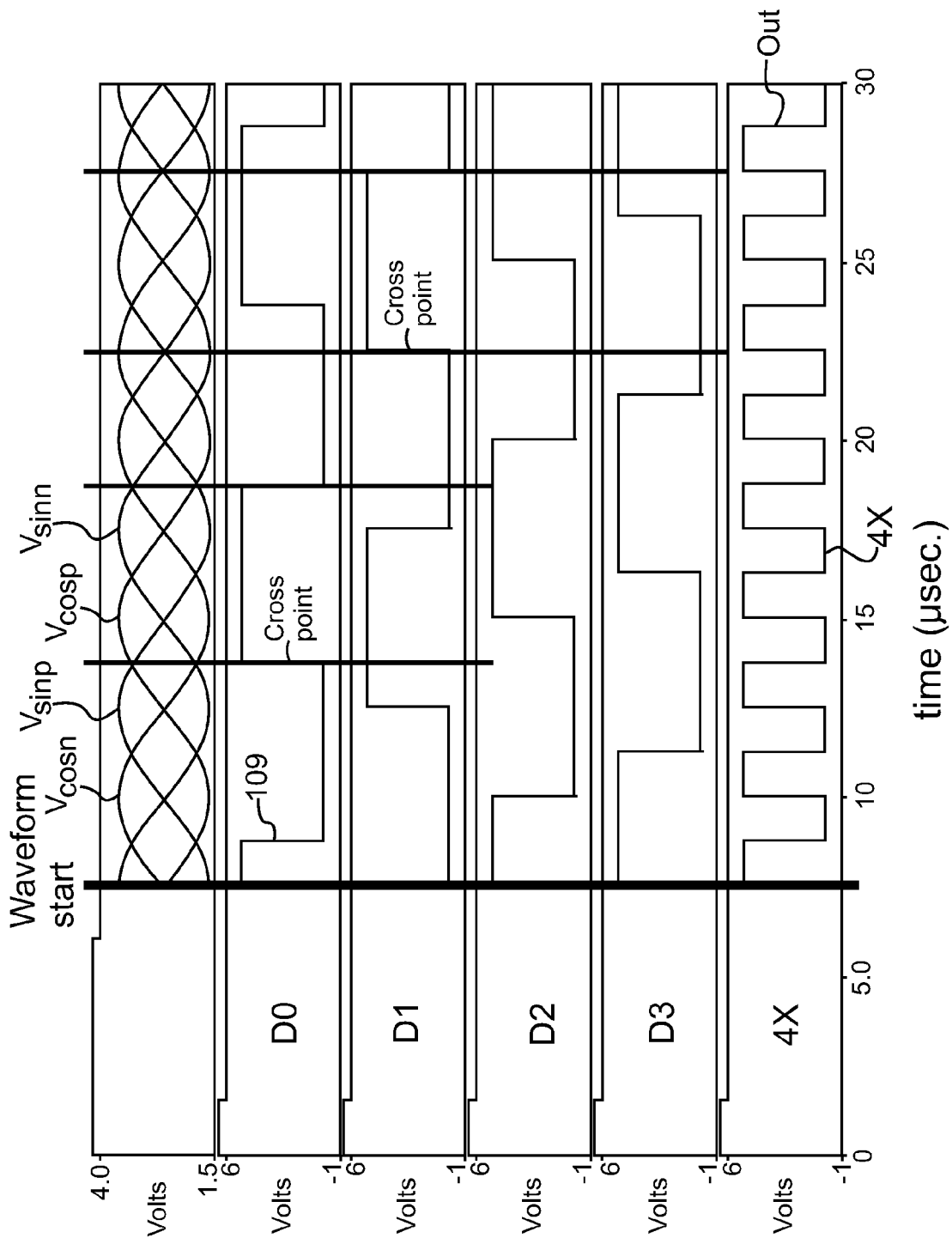
FIG. 17 shows one embodiment of output signals corresponding to circuit 142 and corresponding logic circuit 150 of FIG. 16, and circuit 140 of FIGS. 5 and 6 modified in accordance with the teachings presented herein.
Figure 18:
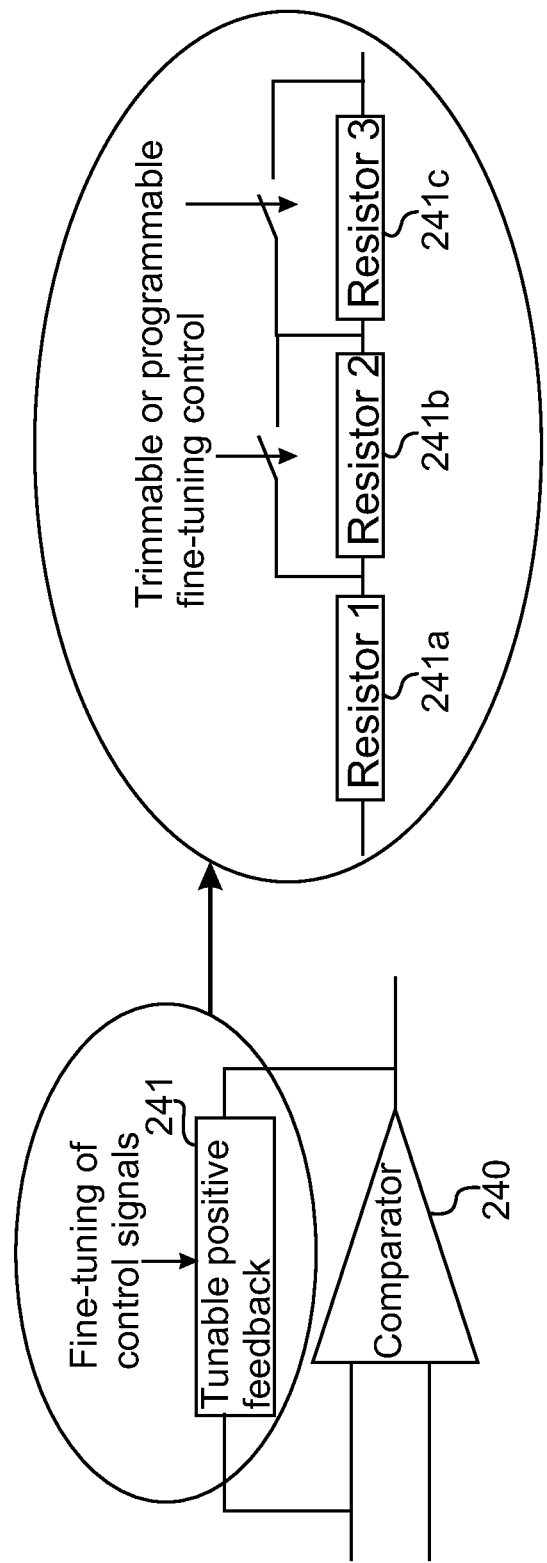
FIG. 18 shows one embodiment of a comparator with a tunable positive feedback loop.

Referring now to FIGS. 16 through 18, there is illustrated another embodiment of a hysteresis-compensating interpolation block for an optical encoder having programmable or trimmable hysteresis settings for each of the comparators included therein, where the hysteresis of each comparator is programmable and/or trimmable for fine-tuning and adjustment. Each of the comparators may be configured to be paired with unique or different input signal amplitudes.

FIG. 16 shows one embodiment of a comparator circuit 142 and corresponding logic circuit 150 for generating a 4X square wave output signal.

FIG. 17 shows the various input and output signals provided to and generated by the circuit shown in FIG. 16.

FIG. 18 shows that each comparators 240 has a tunable positive feedback loop, where resistors 241*a*, 241*b* and 241*c* may be trimmed during manufacturing, or may be programmably controlled using control signals delivered by a controller or processor having preprogrammed instructions loaded in a memory thereof.

Tuning each of the comparators enables precisely-timed crossings to be obtained for each of the square wave edges shown in FIG. 17, even though errors or mismatches may be introduced by part-to-part process variations.

Note that comparator and logic circuitry 142/150 may includes comparators and OR or XOR gates, or any other suitable comparator and logic circuitry known to those skilled in the art.

One example of an encoder that may be modified in accordance with at least some of the embodiments, teachings and disclosure presented herein is the AVAGO TECHNOLOGIES™ AEDT-9340 encoder. A Data Sheet for this encoder is included in an Information Disclosure Statement filed on even date herewith, and is entitled "AEDT-9340 Series; High Temperature 115° C.; 1250/2500 CPR 6-Channel Commutation Encoder," the entirety of which is hereby incorporated herein.

It will now be understood that the various embodiments presented and described herein are simple and easy to implement, and may be integrated using any suitable process technology, such as CMOS or BiCMOS. The various embodiments of current amplifier encoders are well suited for use in high speed applications. Moreover, the various embodiments of current amplifier encoders disclosed herein may be implemented in small die sizes.

Those skilled in the art will now understand that many different combinations, permutations and variations of the novel current amplifier encoders described above, but not necessarily disclosed explicitly herein, can be formulated without departing from the spirit and scope of the invention.

The various embodiments of the invention solve certain problems and have certain advantages. In some embodiments, die sizes may be made smaller, encoder speeds may be increased, manufacturing costs may be reduced, IC design time may be decreased and simplified, and the size and cost of a single track optical encoder can be maintained or even reduced while increasing the spatial resolution of the encoder. Typically, an integrated circuit in a reflective optical encoder is the single most expensive component in a reflective optical encoder system. The small footprints and sizes permitted by the single track configuration disclosed herein permit small encoders with high resolution to be constructed. Various embodiments of the optical reflective encoder also permit higher resolutions to be achieved than possible heretofore, notwithstanding the smaller size and footprint of the encoder.

The various embodiments are relatively simple and easy to implement, and result in smaller packages, reduce die and assembly cost, and use conventional and simple electronic circuitry.

Included within the scope of the present invention are methods of making and having made the various components, devices and systems described herein.

Various embodiments of the invention are contemplated in addition to those disclosed hereinabove. For example, transmissive optical encoders incorporating the single track and other features of the embodiments described hereinabove are specifically contemplated.

The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. A high resolution, high speed, single track optical encoder, comprising:
    a light emitter configured to emit light therefrom;
    a plurality of photodetectors or photodiodes having leading and trailing edges arranged along a single track and a common axis to form a single track light detector, the single track light detector having disposed along the common axis pairs of A and A\ data channel light detectors and B and B\ data channel light detectors, the A and B light detectors, and the A\ and B\ light detectors, respectively, being arranged to generate output signals that are 90 degrees out of phase with respect to one another, the A, A\, B and B\ light detectors generating respective first, second, third and fourth output ramp signals;
    signal generation circuitry comprising at least first, second, third and fourth amplifiers configured to receive as inputs thereto, respectively, the first, second, third and fourth output ramp signals corresponding to the A, A\, B and B\ light detectors, the first amplifier being configured to provide full A and fractional A output ramp signals, the second amplifier being configured to provide full A\ and fractional A\ output ramp signals, the third amplifier being configured to provide full B and fractional B output ramp signals, the fourth amplifier being configured to provide full B\ and fractional B\ output ramp signals;

a first set of first, second, third and fourth resistor ladders configured to receive the full A and fractional A output ramp signals, full A\ and fractional A\ output ramp signals, the B and fractional B output ramp signals, and the full B\ and fractional B\ output ramp signals, respectively, as input signals thereto, respectively, each of the first, second, third and fourth resistor ladders having resistor values associated therewith such that intermediate output signals provided by each of the resistor ladders all have substantially the same slope or complementary slope at any given time;

a first comparator configured to receive the A and fractional A intermediate output signals, a second comparator configured to receive the A\ and fractional A\ intermediate output signals, a third comparator configured to receive the B and fractional B intermediate output signals, and a fourth comparator configured to receive the B\ and fractional B\ intermediate output signals as inputs thereto, the first, second, third and fourth comparators providing intermediate first, second, third and fourth output signals therefrom, respectively, and logic circuitry configured to receive the resistor ladder output signals and generate channel A and channel B output square wave or pulse signals on the basis of the resistor ladder output signals;

wherein the first set of first, second, third and fourth resistor ladders have resistor values associated therewith such that the intermediate output signals provided by each of the resistor ladders all have substantially the same slope or complementary slope at any given time and thereby eliminate differences in hysteresis between the first, second, third and fourth comparators.

2. The high resolution, high speed, single track optical encoder of claim 1, further comprising a second set of first, second, third and fourth tunable resistor ladders configured to receive the intermediate first, second, third and fourth output signals as input signals thereto, respectively, each of the first, second, third and fourth resistor ladders of the second set of resistor ladders having tunable resistances associated therewith that may be selected by first, second, third and fourth control signals delivered thereto, respectively, such that output signals provided by each of the resistor ladders all have substantially the same slope or complementary slope at any given time.

3. The high resolution, high speed, single track optical encoder of claim 1, further comprising a second set of first, second, third and fourth tunable resistor ladders configured to receive the intermediate first, second, third and fourth output signals as input signals thereto, respectively, each of the first, second, third and fourth resistor ladders of the second set of resistor ladders having trimmable resistances associated therewith that may be selected, respectively, such that output signals provided by each of the resistor ladders all have substantially the same slope or complementary slope at any given time.

4. The high resolution, high speed, single track optical encoder of claim 1, wherein at least some of the fractional output ramp signals correspond to about one-third the amplitude of the full output ramp signals.

5. The high resolution, high speed, single track optical encoder of claim 1, wherein at least some of the fractional output ramp signals correspond to about one-sixth the amplitude of the full output ramp signals.

6. The high resolution, high speed, single track optical encoder of claim 1, wherein the signal generation circuitry, the comparators and the logic circuitry are implemented in a CMOS device.

7. The high resolution, high speed, single track optical encoder of claim 1, wherein the signal generation circuitry, the comparators and the logic circuitry are implemented in a BiCMOS device.

8. The high resolution, high speed, single track optical encoder of claim 1, wherein the signal generation circuitry, the comparators and the logic circuitry are implemented in a semiconductor integrated circuit device.

9. The high resolution, high speed, single track optical encoder of claim 1, wherein the hysteresis of the comparators ranges between about 10 mV and about 50 mV.

10. The high resolution, high speed, single track optical encoder of claim 1, wherein the photodetectors or photodiodes are arranged along the single track and the common axis to form a sequential pattern or a repeating sequential pattern of photodetectors or photodiodes defined by one of (A, B, A\, B\), (A, A\, B, B\), (A, B\, A\, B) or (A, B, A\, B\).

11. Circuitry for use in connection with an optical encoder, the circuitry comprising:

a plurality of photodetectors or photodiodes having leading and trailing edges arranged along a single track and a common axis to form a single track light detector, the single track light detector having disposed along the common axis pairs of A and A\ data channel light detectors and B and B\ data channel light detectors, the A and B light detectors, and the A\ and B\ light detectors, respectively, being arranged to generate output signals that are 90 degrees out of phase with respect to one another, the A, A\, B and B\ light detectors generating respective first, second, third and fourth output ramp signals;

signal generation circuitry comprising at least first, second, third and fourth amplifiers configured to receive as inputs thereto, respectively, the first, second, third and fourth output ramp signals corresponding to the A, A\, B and B\ light detectors, the first amplifier being configured to provide full A and fractional A output ramp signals, the second amplifier being configured to provide full A\ and fractional A\ output ramp signals, the third amplifier being configured to provide full B and fractional B output ramp signals, the fourth amplifier being configured to provide full B\ and fractional B\ output ramp signals;

a first set of first, second, third and fourth resistor ladders configured to receive the full A and fractional A output ramp signals, full A\ and fractional A\ output ramp signals, the B and fractional B output ramp signals, and the full B\ and fractional B\ output ramp signals, respectively, as input signals thereto, respectively, each of the first, second, third and fourth resistor ladders having resistor values associated therewith such that intermediate output signals provided by each of the resistor ladders all have substantially the same slope or complementary slope at any given time;

a first comparator configured to receive the A and fractional A intermediate output signals, a second comparator configured to receive the A\ and fractional A\ intermediate output signals, a third comparator configured to receive the B and fractional B intermediate output signals, and a fourth comparator configured to receive the B\ and fractional B\ intermediate output signals as inputs thereto, the first, second, third and fourth comparators providing intermediate first, second, third and fourth output signals therefrom, respectively, and logic circuitry configured to receive the resistor ladder output signals and generate channel A and channel B output square wave or pulse signals on the basis of the resistor ladder output signals;

wherein the first set of first, second, third and fourth resistor ladders have resistor values associated therewith such that the intermediate output signals provided by each of the resistor ladders all have substantially the same slope or complementary slope at any given time and thereby eliminate differences in hysteresis between the first, second, third and fourth comparators.

12. The circuitry of claim 11, wherein at least some of the fractional output ramp signals correspond to about one-third the amplitude of the full output ramp signals.

13. The circuitry of claim 11, wherein at least some of the fractional output ramp signals correspond to about one-sixth the amplitude of the full output ramp signals.

14. The circuitry of claim 11, wherein the signal generation circuitry, the comparators and the logic circuitry are implemented in a CMOS device.

15. The circuitry of claim 11, wherein the signal generation circuitry, the comparators and the logic circuitry are implemented in a BiCMOS device.

16. The circuitry of claim 11, wherein the signal generation circuitry, the comparators and the logic circuitry are implemented in a semiconductor integrated circuit device.

17. The circuitry of claim 11, further comprising a second set of first, second, third and fourth tunable resistor ladders configured to receive the intermediate first, second, third and fourth output signals as input signals thereto, respectively, each of the first, second, third and fourth resistor ladders of the second set of resistor ladders having tunable resistances associated therewith that may be selected by first, second, third and fourth control signals delivered thereto, respectively, such that output signals provided by each of the resistor ladders all have substantially the same slope or complementary slope at any given time.

18. The circuitry of claim 11, wherein further comprising a second set of first, second, third and fourth tunable resistor ladders configured to receive the intermediate first, second, third and fourth output signals as input signals thereto, respectively, each of the first, second, third and fourth resistor ladders of the second set of resistor ladders having trimmable resistances associated therewith that may be selected, respectively, such that output signals provided by each of the resistor ladders all have substantially the same slope or complementary slope at any given time.

19. The circuitry of claim 11, wherein the photodetectors or photodiodes are arranged along the single track and the common axis to form a sequential pattern or a repeating sequential pattern of photodetectors or photodiodes defined by one of (A, B, A\, B\), (A, A\, B, B\), (A, B\, A\, B) or (A, B, A\, B\).

* * * * *